US012373623B2

(12) United States Patent
Eavy et al.

(10) Patent No.: US 12,373,623 B2
(45) Date of Patent: Jul. 29, 2025

(54) SYSTEMS AND METHODS FOR IDENTIFYING AND REMEDIATING ARCHITECTURE RISK

(71) Applicant: JPMORGAN CHASE BANK, N.A., New York, NY (US)

(72) Inventors: Ryan Eavy, Chicago, IL (US); Tayo Ibikunle, Haverford, PA (US)

(73) Assignee: JPMORGAN CHASE BANK, N.A., New York, NY (US)

( * ) Notice: Subject to any disclaimer, the term of this patent is extended or adjusted under 35 U.S.C. 154(b) by 792 days.

(21) Appl. No.: 17/653,781

(22) Filed: Mar. 7, 2022

(65) Prior Publication Data
US 2023/0281368 A1    Sep. 7, 2023

(51) Int. Cl.
*G06N 3/042* (2023.01)
*G06F 18/214* (2023.01)
*G06F 30/333* (2020.01)
*G06F 30/337* (2020.01)
*G06F 30/398* (2020.01)
*G06N 20/00* (2019.01)

(52) U.S. Cl.
CPC .......... *G06F 30/333* (2020.01); *G06F 18/214* (2023.01); *G06F 30/337* (2020.01); *G06F 30/398* (2020.01); *G06N 20/00* (2019.01)

(58) Field of Classification Search
CPC .... G06F 30/333; G06F 18/214; G06F 30/337; G06F 30/398; G06N 20/00; G06N 3/02; G06N 3/042
See application file for complete search history.

(56) References Cited

U.S. PATENT DOCUMENTS

2021/0382725 A1* 12/2021 Vemula ................ G06F 9/4494

* cited by examiner

*Primary Examiner* — Nghia M Doan
(74) *Attorney, Agent, or Firm* — GREENBERG TRAURIG LLP

(57) ABSTRACT

Systems and methods for identifying and remediating architecture risk are disclosed. In one aspect, a method includes generating a first chaos graph pattern and a second chaos graph pattern; training a machine learning model to recognize the first chaos graph pattern and the second chaos graph pattern; identifying an architecture graph pattern of an evaluated architecture; including the architecture graph pattern in an architecture testing graph; recognizing by the machine learning model that a shape of the architecture graph pattern is similar to a shape of the first chaos graph pattern and that the shape of the architecture graph pattern is similar to a shape of the second chaos graph pattern; and predicting a remedial reconfiguration, wherein the remedial reconfiguration includes a reconfiguration of a design of the evaluated architecture.

20 Claims, 10 Drawing Sheets

SYSTEMS AND METHODS FOR IDENTIFYING AND REMEDIATING ARCHITECTURE RISK

RELATED APPLICATIONS

This application is related to the following U.S. patent applications:

patent application Ser. No. 17/653,777, filed Mar. 7, 2022, entitled SYSTEMS AND METHODS FOR BUILDING AN ARCHITECTURE KNOWLEDGE GRAPH;

patent application Ser. No. 17/653,788, filed Mar. 7, 2022, entitled SYSTEMS AND METHODS FOR BUILDING A UNIFIED ASSET GRAPH;

patent application Ser. No. 17/653,797, filed Mar. 7, 2022, entitled SYSTEMS AND METHODS FOR DETERMINING ARCHITECTURE DRIFT; and patent application Ser. No. 17/653,805, filed Mar. 7, 2022, entitled SYSTEMS AND METHODS FOR IDENTIFYING AND REMEDIATING ARCHITECTURE DESIGN DEFECTS.

The disclosure of each of the applications noted, above, is hereby incorporated, by reference, in its entirety.

BACKGROUND

1. Field of the Invention

Aspects are generally related to predicting and remediating technology architecture risk based on machine learning applied to a graph.

2. Description of the Related Art

As application architectures, such as microservice architectures, become more distributed, they become harder to manage and operate. This is particularly true with respect to identifying and remediating risk such as availability of service and other disruptions. The ability to pinpoint potential operational risk and predict areas of architectures where influence of design requires more focus before the potential risk is realized as a point of failure or inefficiency would be a valuable development to organizations with distributed architectures. Further value can be realized through an architecture-aware system that can suggest or even implement remedial measures with respect to perceived risk.

SUMMARY

In some aspects, the techniques described herein relate to a method of identifying and remediating architecture risk, including: generating a first chaos graph pattern and a second chaos graph pattern; training a machine learning model to recognize the first chaos graph pattern and the second chaos graph pattern; identifying an architecture graph pattern of an evaluated architecture; including the architecture graph pattern in an architecture testing graph; processing, by a machine learning engine including the machine learning model, the architecture testing graph, including the architecture graph pattern of the evaluated architecture; recognizing, as a result of the processing and by the machine learning engine, that a shape of the architecture graph pattern is similar to a shape of the first chaos graph pattern and that the shape of the architecture graph pattern is similar to a shape of the second chaos graph pattern; and predicting, by the machine learning engine and based on the recognizing, a remedial reconfiguration, wherein the remedial reconfiguration includes a reconfiguration of a design of the evaluated architecture.

In some aspects, the techniques described herein relate to a method, wherein the first chaos graph pattern is a graph representation of a first operational system operating in a simulated chaos environment.

In some aspects, the techniques described herein relate to a method, wherein the second chaos graph pattern is a graph representation of a second operational system operating in a simulated chaos environment.

In some aspects, the techniques described herein relate to a method, wherein the first chaos graph pattern is labeled as problematic as a result of the first operational system exhibiting a relatively high level of disruption in the simulated chaos environment.

In some aspects, the techniques described herein relate to a method, wherein the second chaos graph pattern is labeled as robust as a result of the second operational system exhibiting a relatively low level of disruption in the simulated chaos environment, or no level of disruption in the simulated chaos environment.

In some aspects, the techniques described herein relate to a method, wherein remedial reconfiguration shifts the shape of the architecture graph pattern to be less similar to the shape of the first chaos graph pattern, and more similar to the shape of the second chaos graph pattern.

In some aspects, the techniques described herein relate to a method, wherein the remedial reconfiguration is presented to a testing user of the testing architecture graph.

In some aspects, the techniques described herein relate to a method, wherein the remedial reconfiguration is automatically applied to the design of the evaluated architecture.

In some aspects, the techniques described herein relate to a method, wherein the remedial reconfiguration is a reconfiguration of a standard architecture design document of the evaluated architecture.

In some aspects, the techniques described herein relate to a method, wherein the architecture graph pattern is an intended state dimension of the evaluated architecture from an architecture knowledge graph.

In some aspects, the techniques described herein relate to a system for identifying and remediating architecture risk including at least one server including a processor and a memory, wherein the at least one server is configured for operative communication on a technology infrastructure of an evaluating organization, and wherein instructions stored on the memory instruct the processor to: generate a first chaos graph pattern and a second chaos graph pattern; train a machine learning model to recognize the first chaos graph pattern and the second chaos graph pattern; identify an architecture graph pattern of an evaluated architecture; include the architecture graph pattern in an architecture testing graph; process, by a machine learning engine including the machine learning model, the architecture testing graph, including the architecture graph pattern of the evaluated architecture; recognize, as a result of the processing and by the machine learning engine, that a shape of the architecture graph pattern is similar to a shape of the first chaos graph pattern and that the shape of the architecture graph pattern is similar to a shape of the second chaos graph pattern; and predict, by the machine learning engine and based on the recognizing, a remedial reconfiguration, wherein the remedial reconfiguration includes a reconfiguration of a design of the evaluated architecture.

In some aspects, the techniques described herein relate to a system, wherein the first chaos graph pattern is a graph representation of a first operational system operating in a simulated chaos environment.

In some aspects, the techniques described herein relate to a system, wherein the second chaos graph pattern is a graph representation of a second operational system operating in a simulated chaos environment.

In some aspects, the techniques described herein relate to a system, wherein the first chaos graph pattern is labeled as problematic as a result of the first operational system exhibiting a relatively high level of disruption in the simulated chaos environment.

In some aspects, the techniques described herein relate to a system, wherein the second chaos graph pattern is labeled as robust as a result of the second operational system exhibiting a relatively low level of disruption in the simulated chaos environment, or no level of disruption in the simulated chaos environment.

In some aspects, the techniques described herein relate to a system, wherein remedial reconfiguration shifts the shape of the architecture graph pattern to be less similar to the shape of the first chaos graph pattern, and more similar to the shape of the second chaos graph pattern.

In some aspects, the techniques described herein relate to a system, wherein the remedial reconfiguration is presented to a testing user of the testing architecture graph.

In some aspects, the techniques described herein relate to a system, wherein the remedial reconfiguration is automatically applied to the design of the evaluated architecture.

In some aspects, the techniques described herein relate to a system, wherein the remedial reconfiguration is a reconfiguration of a standard architecture design document of the evaluated architecture.

In some aspects, the techniques described herein relate to a non-transitory computer readable storage medium, including instructions stored thereon for predicting and remediating technology architecture risk based on machine learning applied to a graph, which when read and executed by one or more computers cause the one or more computers to perform steps including: generating a first chaos graph pattern and a second chaos graph pattern; training a machine learning model to recognize the first chaos graph pattern and the second chaos graph pattern; identifying an architecture graph pattern of an evaluated architecture; including the architecture graph pattern in an architecture testing graph; processing, by a machine learning engine including the machine learning model, the architecture testing graph, including the architecture graph pattern of the evaluated architecture; recognizing, as a result of the processing and by the machine learning engine, that a shape of the architecture graph pattern is similar to a shape of the first chaos graph pattern and that the shape of the architecture graph pattern is similar to a shape of the second chaos graph pattern; and predicting, by the machine learning engine and based on the recognizing, a remedial reconfiguration, wherein the remedial reconfiguration includes a reconfiguration of a design of the evaluated architecture.

DETAILED DESCRIPTION OF EMBODIMENTS

Figure 1:
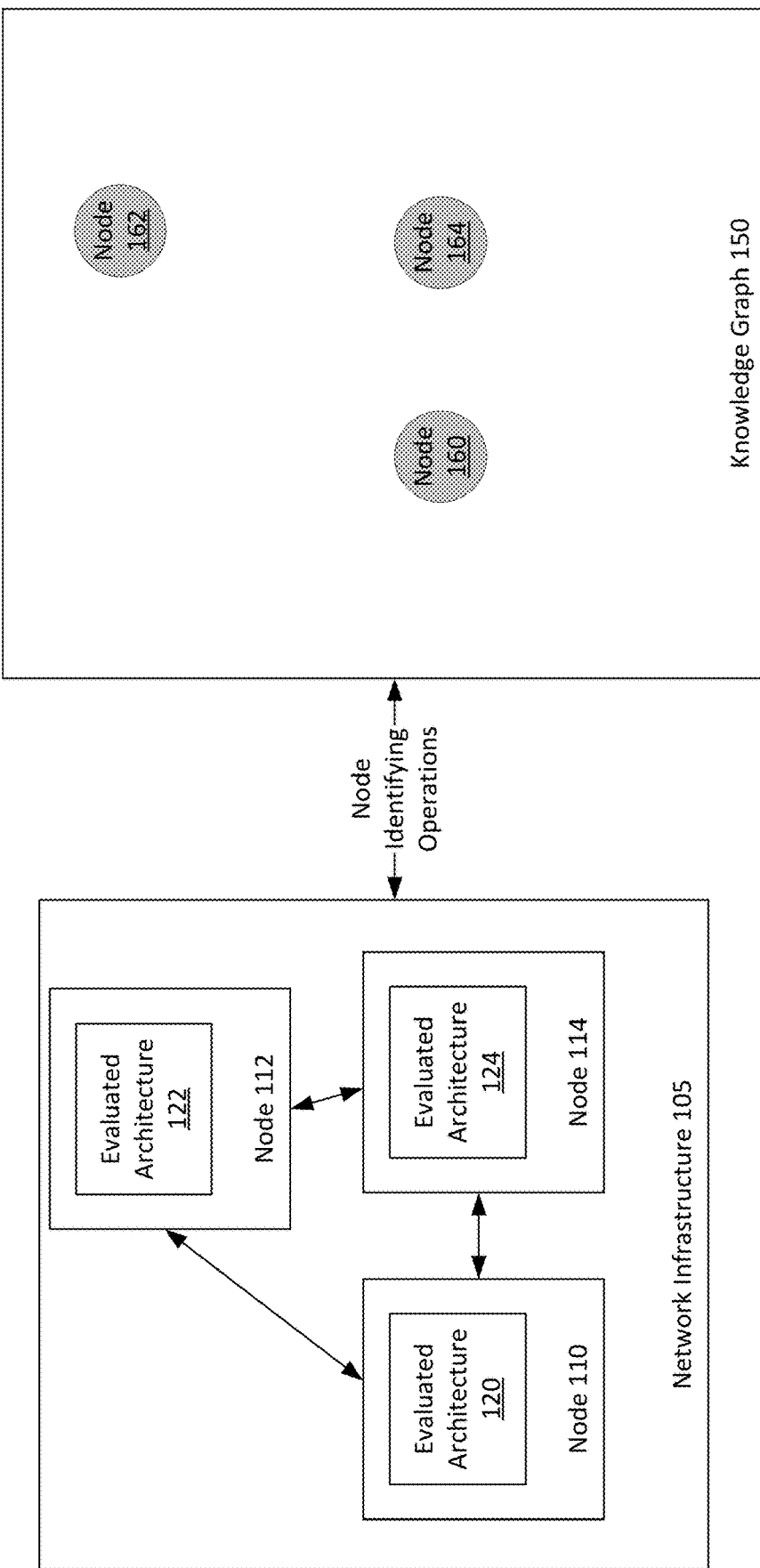
FIG. 1 is a block diagram depicting network infrastructure nodes captured as corresponding architecture graph nodes in a knowledge graph, in accordance with aspects.

Aspects are generally related to predicting and remediating technology architecture risk based on machine learning applied to a graph.

An architecture knowledge graph can be generated from one or more states of an evaluated architecture. A first state can be called the intended state. The intended state represents a technological system functioning entirely as it was designed to function. A second state can be called the functional state. The functional state represents the technological system as it actually functions, e.g., in an operational or production environment.

Any technological system may be evaluated, and the determined information can be used to generate an architecture knowledge graph. That is, any software program, module, package, etc., may be evaluated for information to include in an architecture knowledge graph. Moreover, firmware, embedded code, etc., may be evaluated. In some cases (particularly when evaluating/determining the functional state of a technological system), an evaluation will take place in conjunction with any hardware that the software is designed to, or actually does, execute on, drive, monitor, enhance, etc. As used herein, an "evaluated architecture" refers to a technological system including any necessary software and hardware of the system that is evaluated for information that will be included in an architecture knowledge graph.

Once identified, an intended state and a functional state of an evaluated architecture can be structured as a knowledge graph. In accordance with aspects, a knowledge graph can be queried by personnel of an evaluating organization to determine what architectures (i.e., systems, such as software systems) exist in the organization's infrastructure and what those systems' capabilities and behaviors are. A knowledge graph is an abstraction that organizes real-world knowledge and data. A knowledge graph can integrate determined information from many different data sources and can be used to visualize and explain the determined information, particularly with respect to other information in the knowledge graph.

A knowledge graph can show and explain relationships between entities. The entities are represented in the knowledge graph as nodes and the relationship between the entities are shown as edges (visualized as connections between the nodes). Labels are used to label the edges and explain the relationship between the nodes. Additionally, knowledge graphs can be used in conjunction with machine learning (ML) in order to infer, or "predict," previously unknown or undetermined relationships between, and attributes of, the various nodes in the knowledge graph.

A knowledge graph generated from a determined intended state and a determined functional state of an evaluated architecture can include two dimensions: an intended state dimension that represents the determined intended state of an evaluated architecture, and a functional state dimension that represents the determined functional state of the evaluated architecture. Moreover, a knowledge graph may be generated that represents the intended state dimensions and the functional state dimensions of multiple evaluated architectures. For instance, a knowledge graph can be generated that represents the intended state dimensions and the functional state dimensions of each operational software/hardware solution in an evaluating organization's technology infrastructure. In such an example, each operational software/hardware solution would constitute an evaluated architecture, as further defined herein.

In accordance with aspects, a knowledge graph as described herein can take the form of a directed acyclic graph.

The functional state of an evaluated architecture can be determined from the evaluated architecture's observed configuration and functionality. That is, telemetry data gathered from operational architecture and from a technology infrastructure, can be used to determine a functional state of an evaluated architecture. For instance, a functional state of an observed architecture can be based on the evaluated architecture's interactions within its environment (e.g., a production network environment). An exemplary process (i.e., an exemplary node identifying operation) for observing environmental interactions of an evaluated architecture includes using packet capture tools (PCAPS) to understand network flows on a production network of an evaluating organization. The packet captures can be used to determine a functional state of an evaluated architecture based on the contents of the packets and their destination and origin.

Using packet captures, a network topology can be determined based on network traffic. A determined network topology based on data packets transmitted over a network infrastructure can define network nodes based on the packets transmitted between the nodes. The identified network nodes can represent logical nodes. For instance, hardware may be shared between several evaluated architectures. Each evaluated architecture may execute on a virtual operating system (OS). While the virtual operating systems may share allocated hardware, the virtualized OS may be identified as an independent (logical) network node for evaluation purposes.

Network nodes identified through packet captures (or through other node identifying operations/techniques, described in more detail, below) can be cast as architecture graph nodes on a knowledge graph, and each graph node can represent an evaluated architecture. That is, identified network nodes, architecture graph nodes and evaluated architectures can represent a 1-1-1 ratio with each other, where each identified network node represents an architecture node on the knowledge graph, which, in turn, represents an evaluated architecture. An architecture graph node, as used herein, represents a system, program or other logical node (i.e., an architecture) of an evaluating organization on a knowledge graph.

Network/system nodes may also be determined through various other node identifying operations/techniques. For example, internet protocol (IP) addresses and IP address maps and recorded routes may be used to identify network nodes. Other exemplary aspects include examining deployment mechanisms, records, logs, etc., in order to determine network nodes. For instance, deployment pipelines can be examined to determine what architectures have been deployed onto an evaluating organization's technology infrastructure.

Deployment mechanisms may contain data that verifies other sources of network nodes. For instance, a deployment mechanism may specify an IP address that an architecture was deployed to. The IP address, as determined via the pipeline deployment mechanism may verify a network node discovered via a packet capture operation, or vice versa. Once determined and/or verified through any suitable operation, the identified and/or verified network nodes can be cast onto the knowledge graph as corresponding architecture graph nodes.

In accordance with additional aspects, and as noted above, any suitable operation or process for identifying network nodes for inclusion as corresponding architecture graph nodes in a knowledge graph can be employed. Other exemplary node identifying operations for identifying network nodes include inspecting log files from network operating systems; inspecting/analyzing virtual machine (VM) configuration files; capturing and inspecting/analyzing log files from network routers and switches; examining architecture-as-code (AaC) documentation and/or scripts (described in more detail, below), etc.

FIG. 1 is a block diagram depicting network infrastructure nodes captured as corresponding architecture graph nodes in a knowledge graph. Network infrastructure 105 represents the technology/computer network infrastructure of an evaluating organization. Network infrastructure 105 includes node 110, node 112, and node 114. Executing on node 110 is evaluated architecture 120. Executing on node 112 is evaluated architecture 122, and executing on node 114 is evaluated architecture 124. Each of nodes 110, 112 and 114 represent a logical node configured for networked communication on network infrastructure 105. Network infrastructure 105 is configured with appropriate network communication devices such as network switches/routers (not shown), to facilitate networked communication between nodes 110, 112, and 114.

Evaluated architectures 120, 122, and 124 are software components executing on the hardware that has been (either physically or virtually) allocated to nodes 110, 112, and 114, respectively. Evaluated architectures 120, 122, and 124 each may be any software system that an evaluating organization wishes to evaluate and capture in an architecture knowledge graph—e.g., an accounting software system, a funds settlement software system, an asset trading software system, an MRP/ERP software system, a CRM software system, a bank ledger software system, etc., etc.

Architecture knowledge graph 150 is generated using data collected through node identifying operations performed on network infrastructure 105. Architecture knowledge graph 150 is depicted as a directed acyclic graph in the figures and in accordance with aspects.

Node identifying operations include any suitable technique for identifying logical network nodes on network infrastructure 105 (as further described herein). Once a node is identified through suitable node identifying operations, the node is included in architecture knowledge graph 150 as an architecture node.

With continued reference to FIG. 1, through node identifying operations, node 110 including evaluated architecture 120 was discovered and was included in architecture knowledge graph 150 as corresponding architecture node 160.

Likewise, node 112 and evaluated architecture 122 was identified and corresponding architecture node 162 was included in architecture knowledge graph 150. Similarly, node 114 and evaluated architecture 124 were identified and corresponding node 164 was included in architecture knowledge graph 150. Accordingly, architecture knowledge graph 150 is a representation, in graph form, of the logical architectures of network infrastructure 105.

A knowledge graph generated from network nodes can also include attributes about the network nodes as additional nodes in the graph. Further, edges (i.e., connections representing relationships) can be identified between the architecture nodes and the attribute nodes. Each edge connecting an attribute node to an architecture node can have a label that explains the relationship represented by the edge. In this way, a robust graphical representation of a functional state of an evaluated architecture can be represented by a knowledge graph.

Node identifying operations can also be used as attribute identifying operations, in accordance with aspects. That is, results of the techniques discussed herein for identifying network nodes and evaluated architectures can be further examined to identify functional attributes of the identified nodes. For instance, while a packet captured in a packet capture operation may be examined for an origin address and a destination address in order to identify nodes at the origin and the destination, further examination may be carried out to inspect the type of data the packet carries. Based on the origin and destination of the packet, and the type of data therein, attributes about the sending and receiving nodes can be determined.

Attributes determined based on packet inspection can include dependencies. For example, if a receiving node/evaluated architecture consistently receives a certain type of data from a source node/evaluated architecture, it can be inferred that a dependency exists on the source node/evaluated architecture. Packet capture/inspection may also reveal a particular type of data that can imply a certain data classification. These examples with respect to packet capture/inspection are not meant to be limiting, and other attributes may be determinable through the use of packet capture/inspection used as an attribute identifying operation.

Likewise, many other attribute identifying operations may be employed to determine attributes and corresponding attribute nodes for inclusion in the knowledge graph. As discussed above with respect to node identification, deployment mechanisms (e.g., deployment pipelines) can provide many attributes of corresponding nodes and evaluated architectures. For instance, a deployment mechanism may indicate what operating system and/or platform a particular evaluated architecture was deployed on. Deployment mechanisms may also provide a version number of the evaluated architecture; an internal (i.e., internal to the evaluating organization) identification number of the evaluated architecture; a hosting platform of the evaluated architecture (i.e., a data center location, number, etc.); and the like.

An inspection of repositories and source code therein may also provide many attributes of an evaluated architecture. Some attributes that may be determined through repositories and source code include the coding language that an evaluated architecture was written in; dependencies of the evaluated architecture; whether the evaluated architecture is inward facing, outward facing, or both; etc., etc.

In accordance with aspects, some node and attribute identifying operations may rely on documents that include natural language. Natural language documents can be processed with natural language processing (NLP) engines/algorithms in order to determine both architecture nodes and attribute nodes. Examples of documents/artifacts that can be processed with NLP algorithms include configuration files, property files, project object model (POM) files, VM configuration files, etc.

POM files are XML files that contain information about a project and configuration details used by software project management tools (e.g., Maven™) to build a software project. Some exemplary attributes that are recorded in POM files include source code location, build information, required software dependencies, dependency scope, packaging information, etc.

Natural language-formatted documents can offer a reliable source for node/attribute identification, because they are often organized to include a defined set of information. Further, they are often stored in known locations, and therefore can be easily accessed for processing by NLP engines/algorithms. NLP is discussed in further detail, below, with respect to determining an intended state dimension of a knowledge graph. It is contemplated, however, that NLP and the particular NLP techniques discussed herein are equally applicable to generating both a functional state dimension and an intended state dimension of a knowledge graph.

Identified attributes of architecture nodes can be added to the knowledge graph and edges can be drawn between the architecture node and its corresponding attributes. Labels can be added to the edges to define the relationship between the architecture node and the attribute node. Label values can be derived from a corresponding determined attribute. For instance, if an attribute of an evaluated architecture is "data classification," the relationship may be a "has" relationship, and the value of the attribute may be "highly confidential." In this example, then, the knowledge graph would represent that the evaluated architecture node has a data classification attribute, and the value of that attribute is "highly confidential". With regards to a natural language, the relationship label can be representative of the verb, or predicate, of a sentence.

Figure 2:
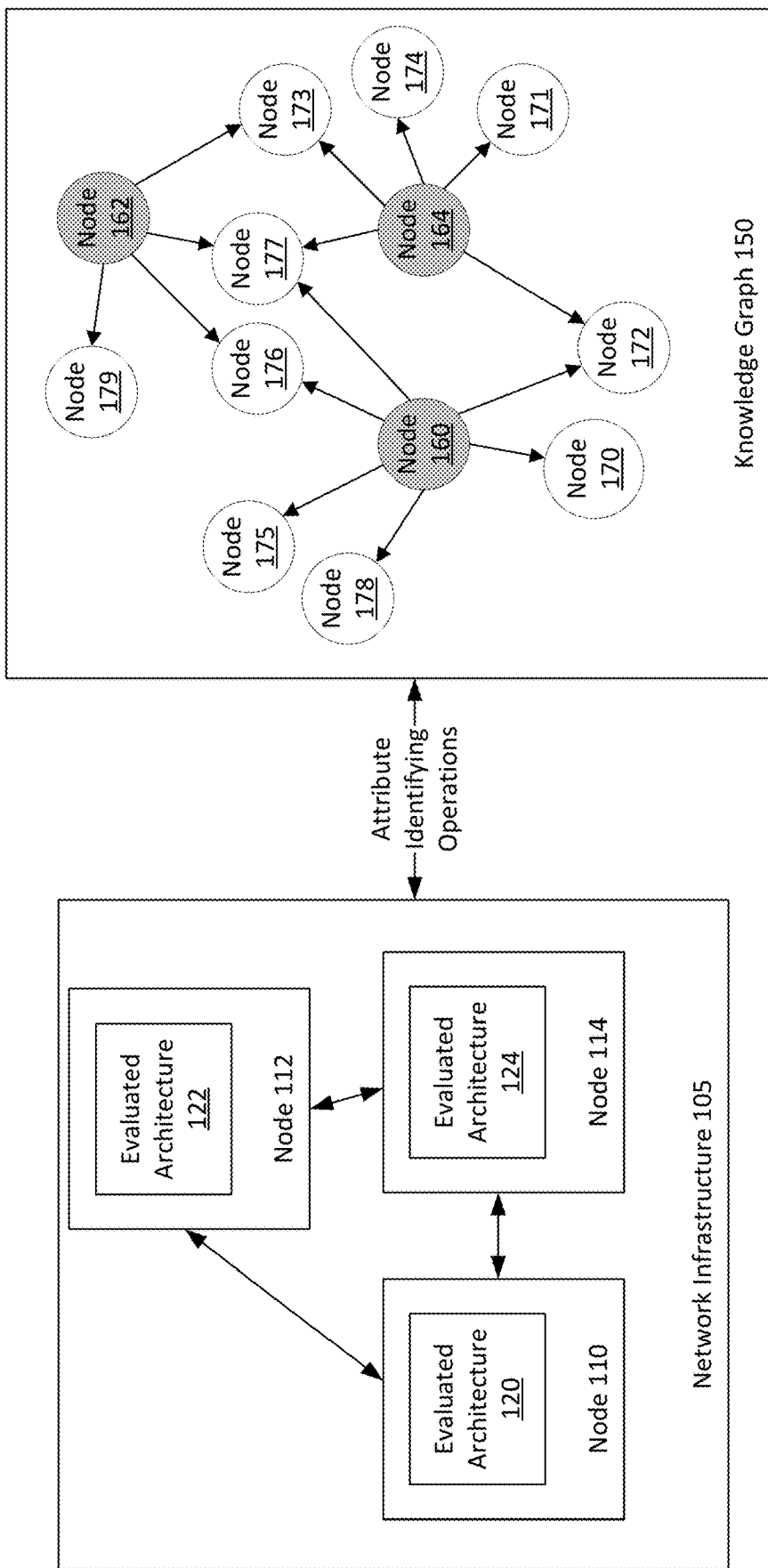
FIG. 2 is a block diagram depicting a knowledge graph generated from a network infrastructure, in accordance with aspects.

FIG. 2 is a block diagram depicting a knowledge graph generated from a network infrastructure, in accordance with aspects. Attribute identifying operations, as discussed herein, have identified attributes of node 110 and evaluated architecture 120; node 112 and evaluated architecture 122; and node 114 and evaluated architecture 124. These attributes have been included in architecture knowledge graph 150 as attribute nodes 170-179. Graph edges (i.e., connections between the architecture nodes and the attribute nodes) have also been generated and included in architecture knowledge graph 150. Graph edges are represented in FIG. 2 as lines/arrows from an architecture node to an attribute node. The depicted edges represent the relationship between an architecture node and an attribute node, in accordance with aspects.

Figure 3:
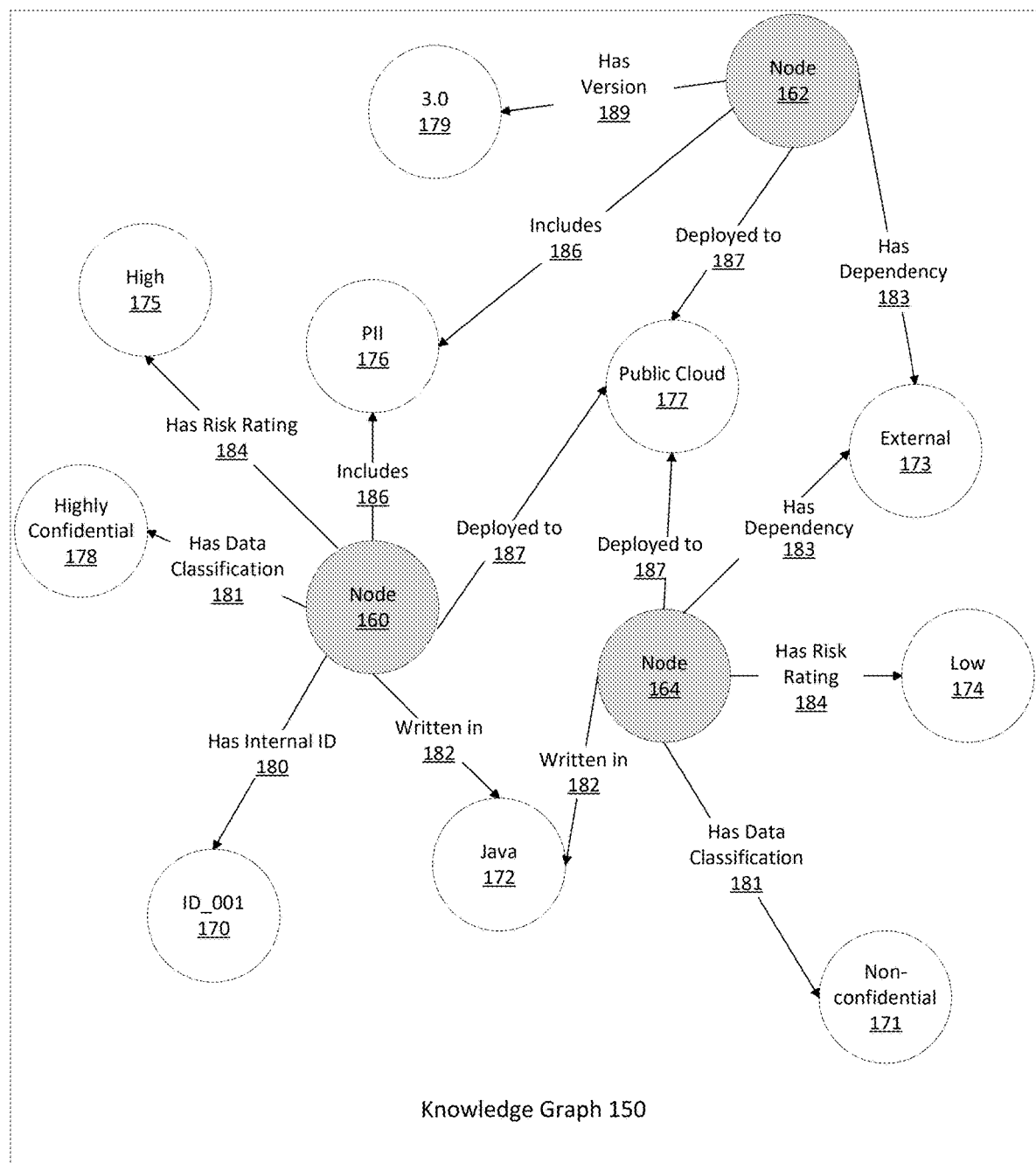
FIG. 3 is a detailed view of a knowledge graph, in accordance with aspects.

FIG. 3 is a detailed view of architecture knowledge graph 150, in accordance with aspects. FIG. 3 shows values of attribute nodes 170-179. FIG. 3 further shows the assigned labels of the graph edges.

FIG. 3 depicts the following: attribute node 170 that has a value of "ID_001." Attribute node 170 is related to evaluated architecture node 160, and the edge has been assigned label 180, which has a value of "has internal ID." In accordance with aspects, and with respect to a natural language presentation of the data in a knowledge graph, labels can take the form of predicates, while architecture nodes serve a subjects and attributes as objects. Consequently, an exemplary relationship captured in architecture knowledge graph 150 can be read as, "architecture node [160] has [180] internal ID ID_001 [170]."

FIG. 3 further depicts the following attributes determined through attribute identifying operations: attribute node 171 that has a value of "non-confidential;" attribute node 172 that has a value of "Java;" attribute node 173 that has a value of "external;" attribute node 174 that has a value of "low;" attribute node 175 that has a value of "high;" attribute node 176 that has a value of "PII" (personally identifiable information); attribute node 177 that has a value of "public cloud;" attribute node 178 that has a value of "highly confidential;" and attribute 179 that has a value of "3.0."

FIG. 3 further depicts determined relationships (edges) between the attribute nodes and the architecture nodes and the labels assigned to each edge in the architecture knowledge graph 150. The labels are as follows: label 180 has a value of "has internal ID;" label 181 has a value of "has data classification;" label 182 has a value of "written in;" label 183 has a value of "has dependency;" label 184 has a value of "has risk rating;" label 186 has a value of "incudes;" label 187 has a value of "deployed to;" and label 179 has a value of "has version."

While some of the figures herein depict graph edges with labels that include an object, it is contemplated that, from a natural, and English, language perspective, objects represent attributes. For instance, in the exemplary relationship depicted in FIG. 3 between architecture node 160, edge 181, and attribute node 178, "data classification" is considered an attribute of architecture node 160 (even though it is depicted as part of the edge label). The attribute "data classification" has a value of "highly confidential." The relationship is a "has" relationship. In accordance with aspects, then, and as shown in some of the figures herein, an attribute can be shown as part of an edge label, with the attribute's value depicted in the attribute node.

As depicted in FIG. 2 and FIG. 3, architecture knowledge graph 150 shows a functional state graph dimension that represents a functional, or observed, state of evaluated architectures 120, 122, and 124 as determined through node identifying operations and attribute identifying operations. In accordance with aspects, and as noted above, an intended state dimension that represents a determined intended state of the evaluated architectures can also be generated and included in a knowledge graph.

In accordance with aspects, an intended state of an evaluated architecture can be a theoretical state in that it may be determined based on the architectural design of the evaluated technological system. For example, an intended state may be determined based on architectural diagrams, flow charts, sequence diagrams, stated/anticipated inputs, stated/anticipated outcomes and outputs (which may be based on the anticipated inputs), stated design intentions and goals, etc. That is, the intended state can be determined by evaluating architecture design documents, documentation, and/or artifacts that may have been generated prior to development and/or provisioning of a given evaluated architecture.

Other examples of information that may be determined from such documentation include related pseudo code, anticipated dependencies, anticipated coding languages and platforms, anticipated hardware environments, known application programming interfaces (APIs) that the evaluated architecture will interact with, other known systems that the evaluated architecture will interact with, etc. This information, and other information discovered in architecture design documents can be used to determine an intended state of an evaluated architecture.

Any architectural and/or design documentation or artifacts created and/or maintained by an evaluating organization may be evaluated to determine the intended state of an evaluated architecture. Any design documentation and artifacts used by an evaluating organization to determine an intended state of an evaluated architecture is collectively referred to herein as "architecture design documentation," or "architecture design documents."

In some aspects, an evaluating organization may collect and organize a repository of architecture design documentation in order to facilitate ease of access to the design intentions included therein. An architecture design documentation repository may include several different types of architecture design documentation.

In some aspects, an evaluating organization may define a standard architecture design document format, which may be included in a architecture design documentation repository. A standard architecture design document format may be defined to include components of, and/or information from, many different types of architecture design documentation. That is, a standard architecture design document format may include standardized data fields or entries that describe design aspects and intentions of an evaluated architecture. The standardized data fields/entries may be included in the standard architecture design document due to their importance or relevance in understanding the intended state of an evaluated architecture.

Exemplary data/information that may be collected in a standard architecture design document includes any information that may be found in any architecture design documentation. That is, a standard architecture design document may include anticipated data inputs, outputs, and other dependencies, a specified coding language, applied design patterns, a required technology platform, required hardware, memory requirements, processing requirements, anticipated network bandwidth, and so on.

A standard architecture design document may include other information such as an identifier that identifies the project/architecture; an information classification that classifies the type of information produced and or stored; indications of whether the architecture is anticipated to be internal or external facing (or both); a repository location for the code and other components of the architecture; and other organization-specific information.

A standard design document may include details about the data that the architecture is anticipated to process, such as an anticipated data classification (e.g., non-confidential, confidential, or highly confidential), an anticipated data risk profile (e.g., low, medium, high), and/or anticipated restrictions on hosting platforms or locations.

In accordance with aspects, a standard architecture design document may be formatted as a natural-language document. A standard architecture design document formatted as a natural-language document may take advantage of natural language processing algorithms in order to determine the contents therein, and in order to employ various machine learning algorithms on the included contents in order to infer relationships and similarities between evaluated systems described in various standard architecture design documentation.

A standard architecture design document may also take the form of an architecture-as-code (AaC) declaration. The AaC concept includes capturing an intended architectural state of a software system (e.g., an evaluated architecture) in a standardized format. The format may be a natural language format, and the entries can be optimized for processing by an NLP, in accordance with aspects.

An exemplary standard architecture design document format can have entries that define attributes of a system, and the relationship between the defined attributes and the subject system. Exemplary entries can be in sentence form, and may include a subject, a predicate (or verb) and an object. Exemplary entries in a standard architecture design document may include:

System: System ABC
Has internal ID 00123456.
Is internal facing.
Has data classification confidential.
Is an internally developed application.
Is written in Java.
Uses Spring boot framework.
Has latency/response SLO (service level objective) of <3170 ms.
Has availability SLO of 98% availability.
Has external dependency on XYZ Platform.

The exemplary standard architecture design document entries, above, can be readily processed by an NLP engine that has been trained on the natural language format (referred to herein as "behavior driven architecture language") of the entries, in accordance with aspects. Behavior driven architecture language includes assertions or intents about an architecture's design written in a natural language (e.g., written in English). A training file may be provided to an NLP algorithm that associates predicates/verbs/verb phrases within the file's entries as relationships. Objects within the entries can be associated with attributes and attribute definitions. The subject system (e.g., System ABC in the example) can be associated with an evaluated architecture.

An NLP engine that has been trained on the behavior driven architecture language can then process standard architecture design documents to determine the intended state of the subject architecture based on the attributes and relationships declared therein. The NLP engine may then output the determined attributes and relationships in a predetermined and machine-readable file format. Exemplary file formats may include JSON, XML, CSV, etc.

In accordance with aspects, a knowledge graph can be generated based on a machine-readable file format. A machine-readable file format can include tags or indicators that organize the output of an NLP engine to maintain the subject-verb-object structure (which corresponds to the nodes and relationships of a directed cyclic knowledge graph). For instance, if an NLP engine produces a JSON formatted file for an evaluated architecture (e.g., System ABC), including any determined attributes, values and relationships, the JSON file can act as a JSON-formatted representation of a knowledge graph (or at least part of a knowledge graph that may include data from many similar JSON files). The contents of the JSON file can be readily formatted, and displayed as, a knowledge graph of the determined intended state of a subject system as declared in a corresponding standard architecture design document. The normalized format of design assertions extracted from architecture design documents and formatted in a machine-readable file format that is represented in a knowledge graph is referred to as behavior graph language.

In the same manner, architectures, attributes, attribute values, and relationship signifiers determined through attribute identifying operations and node identifying operations can be normalized and formatted in a machine-readable file format (i.e., can be formatted in behavior graph language). Subsequently, a functional state dimension of a knowledge graph can be generated from the machine-readable files.

Figure 6:
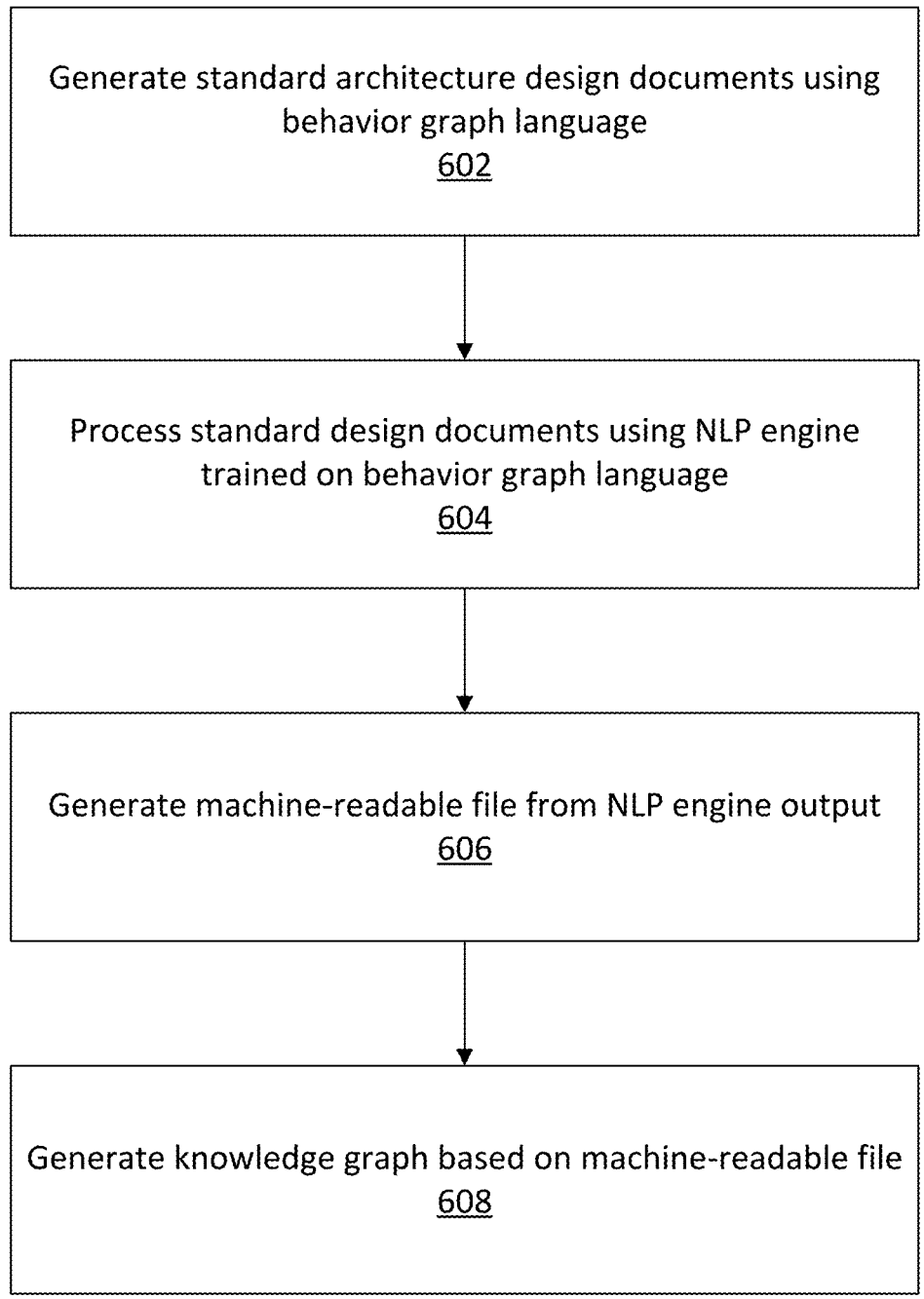
FIG. 6 is a flow chart for generating a knowledge graph from standard architecture design documents, in accordance with aspects.

FIG. 6 is a flow chart for generating a knowledge graph from standard architecture design documents, in accordance with aspects. At step 602, standard architecture design documents are generated using a behavior driven architecture language. At step 604, the standard architecture design documents are processed using an NLP engine that has been trained to process the standard architecture design documents and recognize graph relevant relationships asserted with the behavior driven architecture language in which the design document is written. At step 606, a machine-readable file is generated from the output of the NLP engine (e.g., a JSON file). At step 608, a knowledge graph is formatted based on the machine-readable file.

In other aspects, standard architecture design documents may take any suitable or desirable format. Non-ML algorithmic approaches (for example, file "scraping") may be used to extract data from structured architecture design documents where NLP is not applicable, or in addition to NLP processing. In accordance with aspects, data scraped from architecture design documents may be later processed by an NLP algorithm or other ML algorithm. In accordance with aspects, standard architecture design documents may also take the form of design data collected in a normalized relational database, or an OLAP database, including reports therefrom.

In accordance with aspects, architecture design documentation may be processed as described herein, and an intended state dimension of a knowledge graph may be generated based on the data and information obtained from the processed architecture design documentation. Architecture nodes may be discovered through the processing of the architecture design documentation, and these nodes may be added to a knowledge graph, or a verification process may be undertook to verify that the discovered architecture nodes have already been added to an existing knowledge graph. Thereafter, intended attributes of an evaluated architecture that have been determined through the processing of architecture design documentation can be added to the knowledge graph. Edges connecting the determined intended attributes to their corresponding architecture nodes can also be added to the knowledge graph, and corresponding labels may, in turn, be added to the edges.

Figure 4:
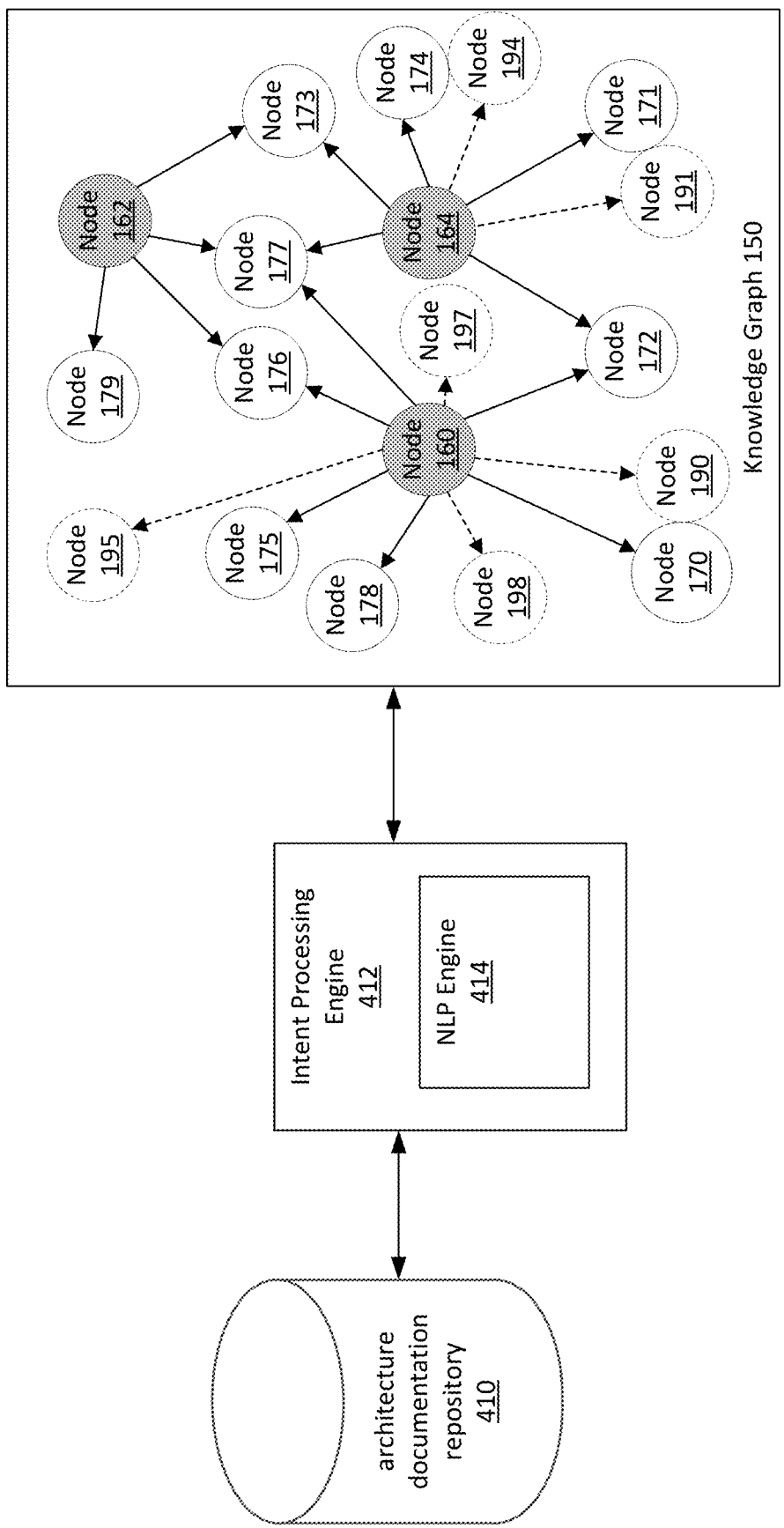
FIG. 4 is a block diagram of a system for generating an intended state dimension of a knowledge graph, in accordance with aspects.

FIG. 4 is a block diagram of a system for generating an intended state dimension of a knowledge graph, in accordance with aspects. FIG. 4 depicts architecture documentation repository 410, and intent processing engine 412. Intent processing engine 412 may include NLP engine 414. Architecture documentation repository 410 stores architecture design documents as described herein. Architecture documentation repository 410 may be any suitable data store, such as a relational data base (e.g., a relational database configured to store architecture design documents as binary large objects (BLOBs)), a flat-file architecture, a folder structure, etc.

Intent processing engine 412 is configured to access architecture documentation repository 410 and process the architecture design documents therein. Intent processing engine 412 may include NLP engine 414, which, in turn, may include NLP processing algorithms. Intent processing engine 412 may further include other ML algorithms, or non-ML processing algorithms configured to process the architecture design documents, as described in further detail herein.

With continued reference to FIG. 4, shown is architecture knowledge graph 150. Architecture knowledge graph 150 is shown as including the determined functional state dimension (as described with respect to FIGS. 1-3, above), in accordance with aspects. It is contemplated, however, that a determined functional state dimension need not be previously determined or included in architecture knowledge graph 150 in order to determine an intended state and include that state as an intended state dimension in the knowledge graph. Architecture knowledge graph 150 is depicted as having an intended state dimension included. In accordance with aspects, the intended state dimension, including intended attributes of architecture attributes 160, 162, and 164 have been determined by intent processing engine 412 based on architecture design documentation accessed from architecture documentation repository 410.

The intended state dimension that has been included in architecture knowledge graph 150 is shown in broken lines, to help distinguish it from the functional state dimension (that is shown in solid lines) and from the architecture node (shown in solid lines, and shaded). Accordingly, as shown in architecture knowledge graph 150 as depicted in FIG. 4, the determined intended state dimension includes intended attribute node 190, intended attribute node 191, intended attribute node 194, intended attribute node 195, intended attribute node 197 and intended attribute node 198. The intended state dimension further includes corresponding edges indicating relationships with corresponding architecture nodes.

Figure 5:
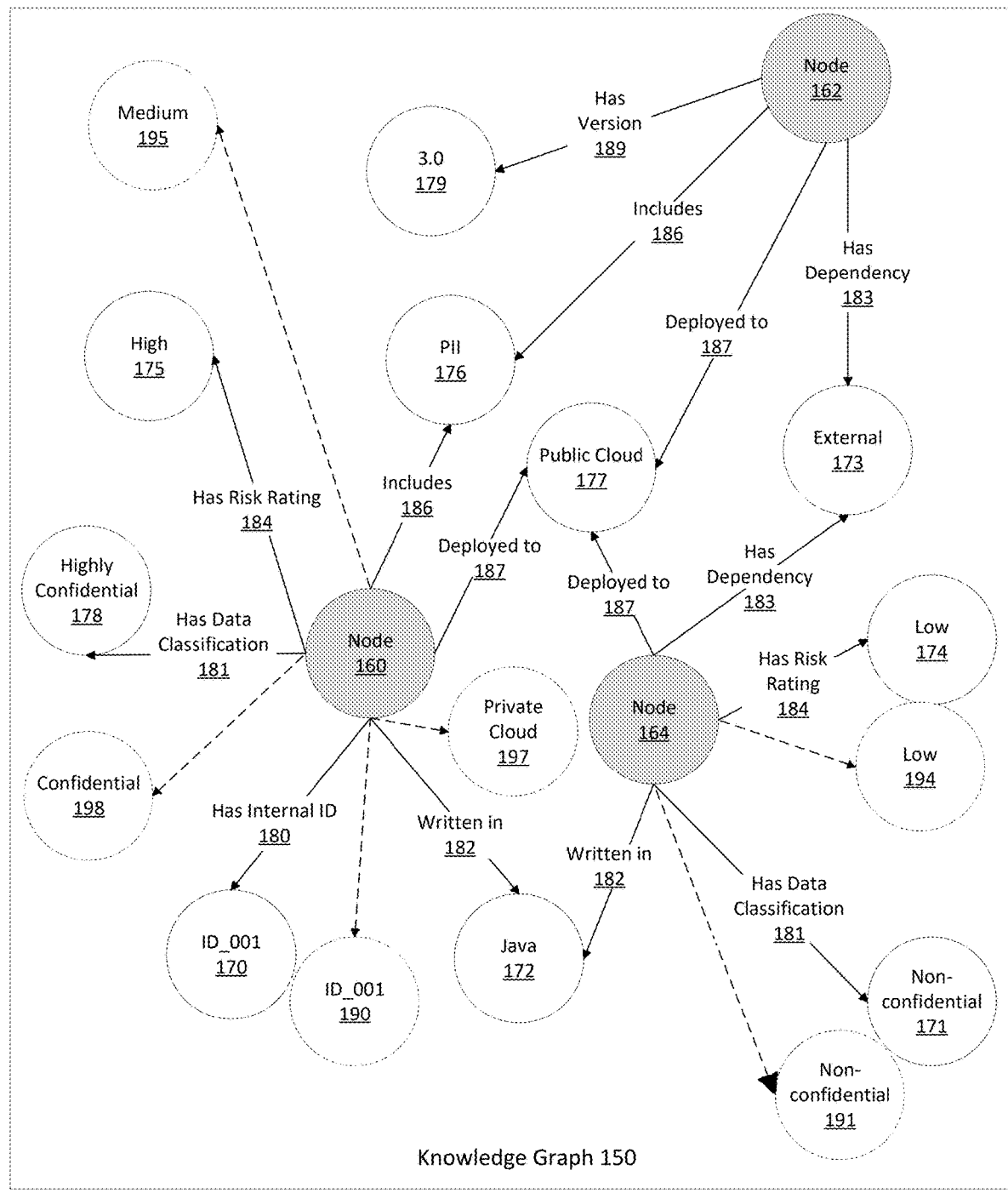
FIG. 5 is a detailed view of a knowledge graph, in accordance with aspects.

FIG. 5 is a detailed view of a knowledge graph, in accordance with aspects. FIG. 5 depicts a detailed view of architecture knowledge graph 150, including both an intended state dimension and a functional state dimension. The intended state dimension is shown in broken lines and the functional state dimension is shown in solid lines. The architecture nodes are shown in solid lines and are shaded.

In FIG. 5, the determined intended attributes of architecture node 160 include intended attribute node 190 that has a value of "ID_001;" intended attribute node 195 that has a value of "medium;" intended attribute node 197 that has a value of "private cloud;" and intended attribute node 198 that has a value of "confidential." Likewise, intended attributes nodes of architecture node 164 have been determined and include intended attribute node 191 that has a value of "non-confidential;" and intended attribute node 194 that has a value of "low." Edges corresponding to the determined intended attribute nodes have also been determined and included in architecture knowledge graph 150.

Because of space constraints of FIG. 5, the edges of the intended state dimension are not shown with labels. However, the edges of the intended state dimension are assigned the same label as their corresponding functional state attributes. That is, the edge connecting intended attribute node 190 has been assigned label 180 (i.e., with a value of "has internal ID"); the edge connecting intended attribute node 191 has been assigned label 181; the edge connecting intended attribute node 194 has been assigned label 184; the edge connecting intended attribute node 195 has been assigned label 184; the edge connecting intended attribute node 197 has been assigned label 187; and the edge connecting intended attribute node 190 has been assigned label 181. Due to space constraints of FIG. 5, no intended attribute nodes have been shown for architecture node 162, however, it is contemplated that the determining processes as described herein would have determined intended attribute nodes and corresponding edges and would have included them in architecture knowledge graph 150.

In accordance with aspects, an architecture knowledge graph, as described above, captures information about an evaluating organization's technology infrastructure and the software architectures executing on that infrastructure. In accordance with aspects, machine learning (ML) algorithms can process an architecture knowledge graph to determine patterns within the graph.

As described above, an intended state dimension of an architecture knowledge graph can be based, at least in part, on architecture design documents. Some or all of the architecture design documents may be standard architecture design documents. By building an architecture knowledge graph through architecture design documentation, the design patterns of evaluated architectures can be captured in the architecture knowledge graph. For instance, a standard architecture design document for a microservice can reflect design patterns that an evaluating organization has standardized for microservices that execute on its technology infrastructure. Moreover, by employing telemetry data to build a functional state dimension of an architecture knowledge graph, a broader shape, or pattern, of a given architecture can be recognized.

For example, in an architecture knowledge graph representative of a technology infrastructure with a large number of microservice applications, the nodes and edges that represent each microservice application will tend to have a similar shape, or form a similar pattern, based on a microservice design pattern adopted by the evaluating organization. That is, the microservice design pattern adopted by an evaluating organization can be included in its architecture design documentation, and that design pattern can be reflected in a representative architecture knowledge graph (e.g., in an intended state dimension of the architecture knowledge graph). Exemplary characteristics that define an evaluated architecture's graph pattern can include a technology stack, a design pattern, known dependencies, etc.

Dependencies can broaden the shape or pattern of an evaluated architecture. Telemetry data collected and used in the formation of a functional state dimension of an architecture knowledge graph can be representative of dependencies not recorded in architecture design documentation. For instance, data flows into and out of evaluated architectures (which may be captured through PCAPS, or other observations, as discussed above) can further broaden an evaluated architecture's shape/pattern in the architecture knowledge graph.

In accordance with aspects, an ML model, such as a neural network model, can process an architecture knowledge graph to identify patterns of an evaluated architecture. These graph patterns of evaluated architectures are referred to herein as, "evaluated architecture graph patterns," or simply "graph patterns." Once identified, these graph patterns can be added to an architecture testing graph.

An architecture testing graph is a graph that can be based on one or more identified graph patterns of evaluated architectures. An architecture testing graph allows simulations to be "performed" on identified patterns of evaluated architectures. For example, simulated chaos events can be performed on identified patterns of evaluated architectures, and predictions can be made regarding points of failure or inefficiency in the evaluated architectures. "Performance" with respect to an architecture testing graph can be understood as comparisons of learned patterns with observed patterns to identify different scenarios.

In accordance with aspects, new design patterns can be tested in an architecture testing graph before they are deployed into a production environment. A new design pattern (e.g., a new or updated microservice design pattern) can be represented by its intended state dimension generated in an architecture knowledge graph. The intended state dimension may be theoretical in the sense that it may not be deployed yet, and therefore will have no telemetry data from which to generate a functional state dimension. A broader graph pattern representing the new design pattern (i.e., broader than merely the intended state dimension) can be accomplished in an architecture testing graph, however, based on known graph patterns for similar design patterns, which are, in turn, based on telemetry data observed for similar design patterns.

Thus, dependencies may be built out (broadened) in an architecture testing graph where the dependencies originate in architecture design documentation, or from understanding broader patterns in an architecture knowledge graph. For instance, a data flow dependency may not be captured in an architecture design document for a given evaluated architecture, since it may be outside the knowledge of the designers or the scope of the design document. But it may be known, based on ML processing of an architecture knowledge graph, that the dataflow dependency will be part of a broader graph pattern of the new design pattern.

Introducing chaos to an operational technology infrastructure can provide insight as to how architectures will behave when the chaos is introduced. Exemplary simulated chaos events include intentionally powering down different hardware/software systems within an infrastructure, removing network connectivity from certain systems, forcing network/data route changes, etc. Generally, simulated chaos can be described as introducing any disruptive or unplanned scenarios into an operational environment in order to observe how a system, several systems, or an infrastructure will react.

Testing architectures with simulated chaos events allows the tester to understand how a tested architecture will behave in a particular scenario. Based on tests involving simulated chaos, a testing organization can understand chaos situations that are highly disruptive to tested architectures, chaos situations that are mildly disruptive to tested architectures, and chaos situations that have a minimal, or no effect on tested architectures.

In terms of an architecture testing graph, a simulated chaos event can be represented by an observed graph pattern of an evaluated architecture and/or infrastructure during a chaos event. For instance, if a simulated chaos event disables a known dependency of an evaluated architecture, then the dependency will be absent on a graph of the evaluated architecture generated during the chaos event.

Accordingly, graph patterns that represent simulated chaos events for different evaluated architectures can be understood as patterns that indicate high disruption to the represented architecture, mild disruption to the represented architecture, and low or no disruption to the represented architecture. Graph patterns that represent evaluated architectures during chaos events are referred to herein as "chaos graph patterns."

Chaos graph patterns can be used to train ML models to recognize evaluated architecture patterns that indicate the noted degrees (or finer-grained degrees) of architecture disruption. These models can then identify architecture graph patterns representing new design patterns (e.g., software design patterns, microservice architecture patterns, etc.) or previously un-graphed design patterns, that indicate the noted degrees (or finer-grained degrees) of architecture disruption. That is, an appropriate ML model, which has been appropriately trained on chaos graph patterns, can alert an evaluating organization to design patterns that indicate particularly high vulnerability to relatively common chaos scenarios. Conversely, these ML models can also be used to identify particularly robust architectures and design patterns that exhibit resiliency when introduced to common or even rare chaos events. Moreover, the ML models can predict reconfigurations of problematic design patterns based on known robust patterns in order to strengthen a problematic design pattern. Such reconfigurations can be presented to designers, or even integrated automatically, in accordance with aspects.

Figure 7:
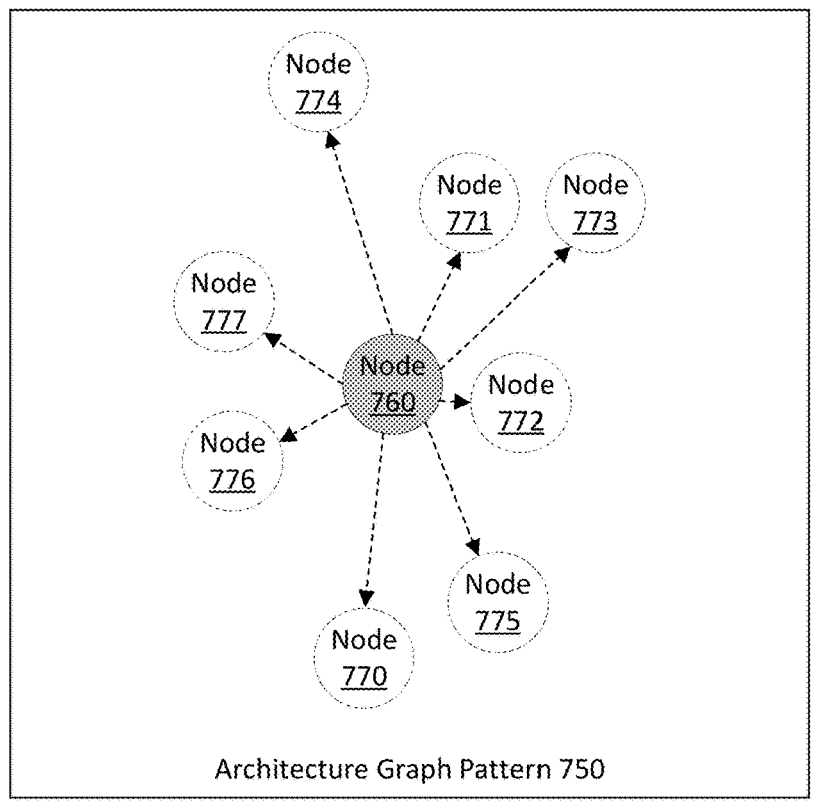
FIG. 7 is a block diagram of a architecture graph pattern, in accordance with aspects.

FIG. 7 is a block diagram of a architecture graph pattern, in accordance with aspects. FIG. 7 shows architecture graph node 760. FIG. 7 further shows intended attribute nodes 770-777. Architecture graph pattern 750 depicts an intended state dimension of an evaluated architecture. In accordance with aspects, architecture graph pattern 750 may represent a new design pattern (e.g., a new microservice design pattern that is adopted by the evaluating organization) that was generated from a new architecture design document.

Figure 8:
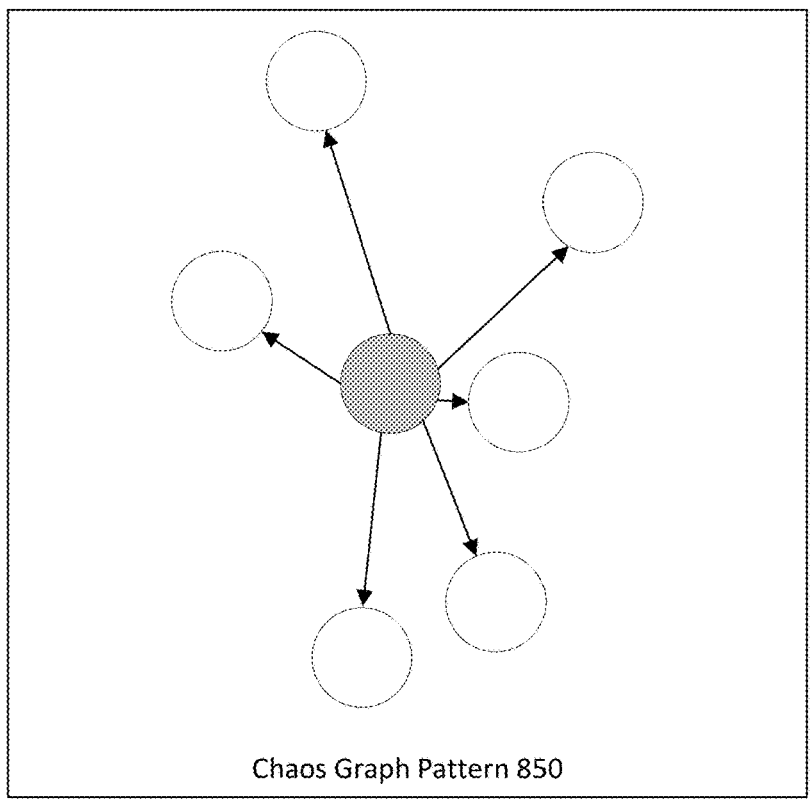
FIG. 8 is a block diagram of a chaos graph pattern, in accordance with embodiments.

FIG. 8 is a block diagram of a chaos graph pattern, in accordance with aspects. Chaos graph pattern 850 represents a pattern of an operational evaluated architecture that has been introduced to one or more chaos events. In accordance with aspects, the introduced chaos events may have caused a high level of disruption to the evaluated architecture. Accordingly, chaos graph pattern 850 may have been determined to represent a graph pattern that indicates a problematic pattern when it is recognized in an architecture testing graph. Chaos graph pattern 850, then, can be used to train a ML algorithm to recognize this pattern as a problematic pattern when processing architecture testing graphs.

In accordance with aspects, exemplary ML models for processing graphs include graph neural network variants such as a graph convolutional network (GCN), a graph attention network (GAT), a graph recurrent network (GRN), etc. However, these examples are not meant to be limiting, and any suitable machine learning model may be employed in aspects disclosed herein.

Figure 9:
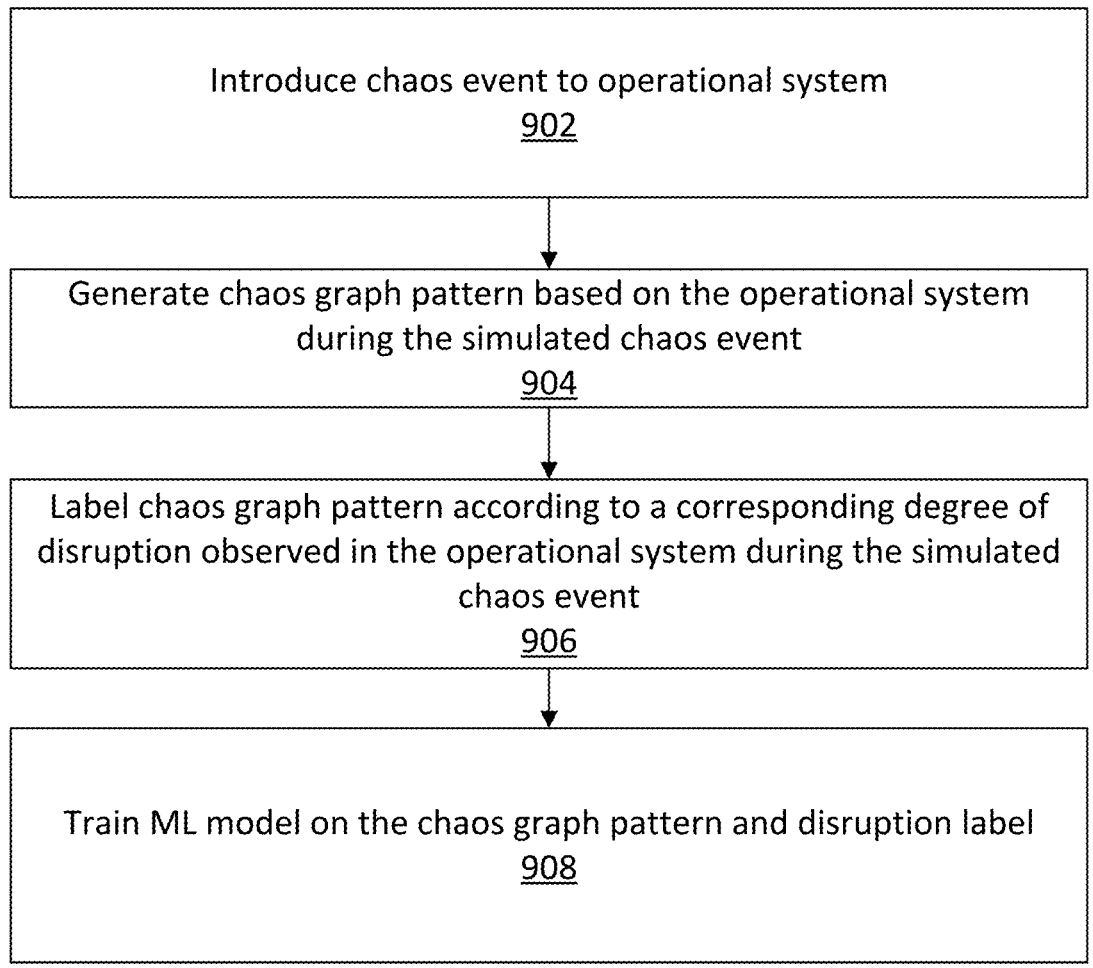
FIG. 9 is a logical flow for training an ML algorithm to recognize chaos graph patterns, in accordance with aspects.

FIG. 9 is a logical flow for training an ML algorithm to recognize chaos graph patterns, in accordance with aspects. At step 902, simulated chaos events are introduced to an operational system (e.g., an operational evaluated architecture). At step 904, a chaos graph pattern is generated based on the operational system operating during the simulated chaos event. At step 906, the chaos graph pattern is labeled with a degree of disruption, where the degree of disruption is representative of the degree of disruption that the simulated chaos event caused to the operational system. At step 908, the chaos graph pattern and the disruption label are used to train an ML model. The trained ML model can then be used to identify the chaos graph pattern, in, e.g., an architecture testing graph, and associate it with the degree of disruption indicated in the disruption label.

In accordance with aspects, an architecture graph pattern generated in an architecture knowledge graph (as, e.g., an intended state dimension of an evaluated architecture), and can be included in an architecture testing graph in order to be evaluated by ML models that have been trained to recognized chaos graph patterns and identify when the included architecture graph pattern is similar to a learned chaos graph pattern. If, while processing the architecture graph pattern, the ML model determines that the architecture graph pattern is similar to a chaos pattern that is labeled as a problematic pattern (i.e., a pattern that had high levels of disruption during a simulated chaos event), then the ML model can indicate this to a testing administrator.

Figure 10A:
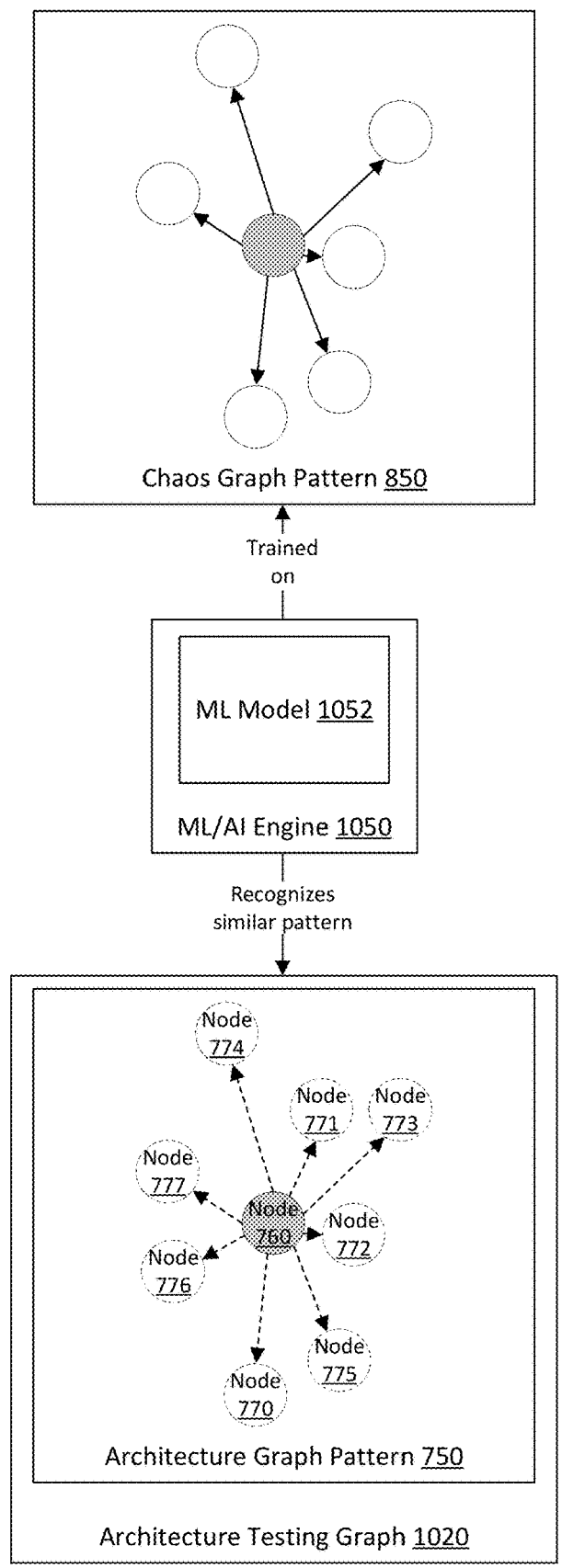
FIG. 10a is a block diagram of a system for identifying architecture risk, in accordance with aspects.

FIG. 10A is a block diagram of a system for identifying architecture risk, in accordance with aspects. ML engine 1050, which manages ML model 1052, can be trained to recognize chaos graph pattern 850. Chaos graph pattern 850 may be labeled as a problematic (highly disrupted) pattern. When processing architecture graph pattern 750 in architecture testing graph 1020, ML engine 1050 may recognize architecture graph pattern 750 as similar to Chaos graph pattern 850, and may report architecture graph pattern 750 as such. In this way, the designers and architects of the design pattern that architecture graph pattern 750 represents can be made aware that the design pattern is not particularly robust in a given scenario.

However, ML engine 1050, can also be trained to recognize robust chaos graph patterns. That is, chaos graph patterns that represent design patterns that exhibited very robust behavior (e.g., a high degree of resiliency and low operational disruption) when introduced to simulated chaos. Further, ML engine 1050 can be configured to determine a reconfiguration of a problematic design pattern in order to strengthen the tested design.

Figure 10B:
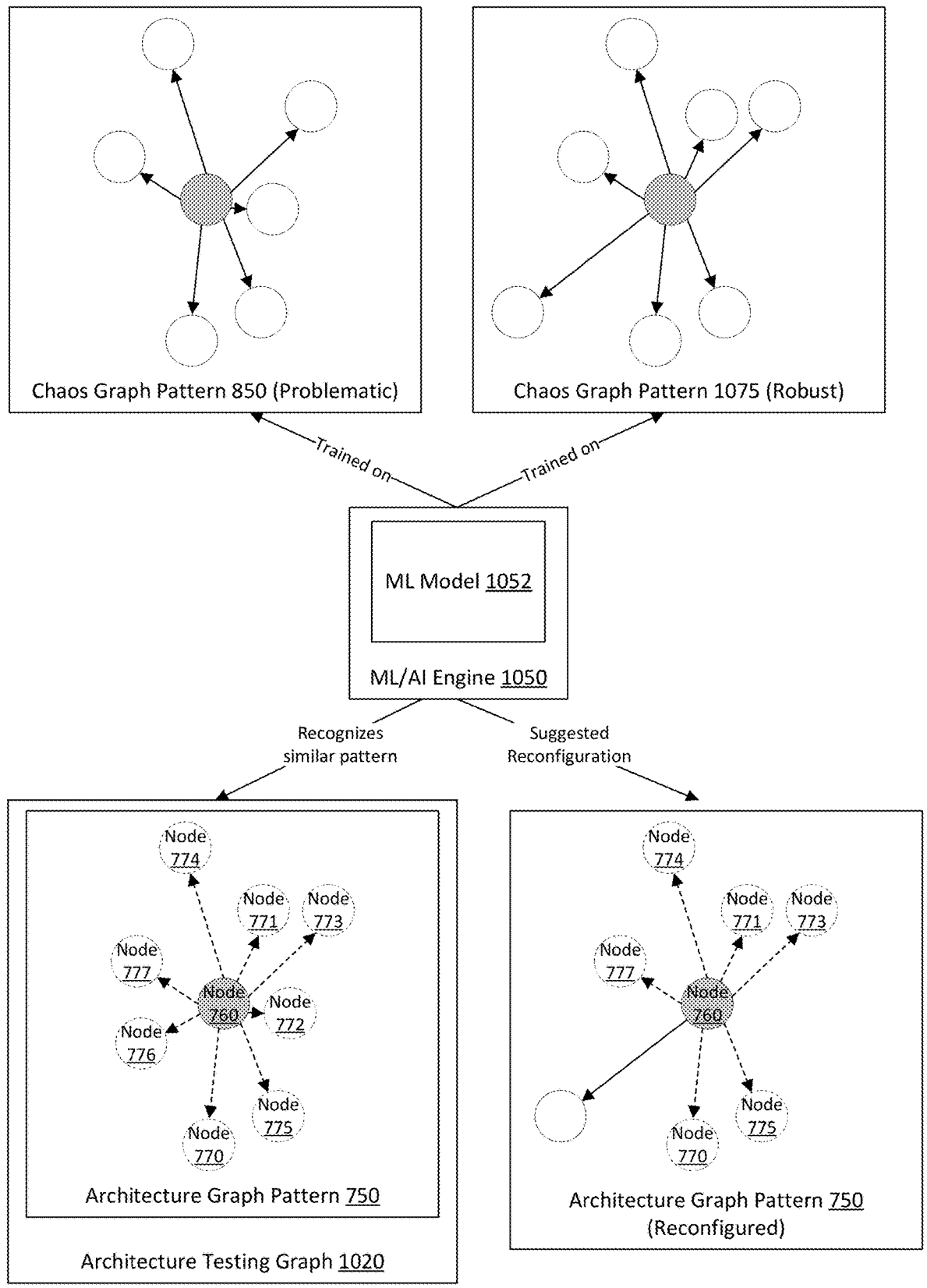
FIG. 10b is a block diagram of a system for identifying and remediating architecture risk, in accordance with aspects.

FIG. 10B is a block diagram of a system for identifying and remediating architecture risk, in accordance with aspects. As noted with reference to FIG. 10A, ML engine 1050 may recognize architecture graph pattern 750 as similar to (problematic) chaos graph pattern 850, and therefor determine that architecture graph pattern 750 is also problematic and therefore introduces risk to the enterprise technology infrastructure. ML model 1052 may also have been trained to recognize chaos graph pattern 1075. Chaos graph pattern 1075, however, may be a graph pattern that represents a design pattern which exhibited particular robustness, resiliency, and/or a low or no level of disruption during a simulated chaos event. The simulated chaos event may have been the same chaos event under which chaos graph pattern 850 exhibited problematic behavior, including a high degree of disruption.

Accordingly, ML engine 1050 can recognize that given certain reconfigurations in design, the graph shape of architecture graph pattern 750 can be made to more closely resemble that of robust chaos graph pattern 1075, while, at the same time, be shifted away from the shape of problematic chaos graph pattern 850. Once this determination is made, ML engine 1050 can present the predicted remedial reconfiguration to the testing users of architecture testing graph 1020.

In accordance with aspects, the predicted remedial reconfiguration can take different forms, depending on the evaluated architecture that architecture graph pattern 750 represents. For instance, it may be a change to source code of the evaluated architecture. It may be a change to a service level objective (SLO) of the design pattern of the evaluated architecture. It may be a reconfiguration in a number of proxy systems expected to be available to the evaluated architecture, etc., etc. In accordance with aspects, systems may be configured to automatically initiate and/or implement predicted remedial reconfigurations, as appropriate.

Hereinafter, general aspects of implementation of the systems and methods of the invention will be described.

The system of the invention or portions of the system of the invention may be in the form of a "processing machine," such as a general-purpose computer, for example. As used herein, the term "processing machine" is to be understood to include at least one processor that uses at least one memory. The at least one memory stores a set of instructions. The instructions may be either permanently or temporarily stored in the memory or memories of the processing machine. The processor executes the instructions that are stored in the memory or memories in order to process data. The set of instructions may include various instructions that perform a particular task or tasks, such as those tasks described above. Such a set of instructions for performing a particular task may be characterized as a program, software program, or simply software.

In one embodiment, the processing machine may be a specialized processor.

As noted above, the processing machine executes the instructions that are stored in the memory or memories to process data. This processing of data may be in response to commands by a user or users of the processing machine, in response to previous processing, in response to a request by another processing machine and/or any other input, for example.

As noted above, the processing machine used to implement the invention may be a general-purpose computer. However, the processing machine described above may also utilize any of a wide variety of other technologies including a special purpose computer, a computer system including, for example, a microcomputer, mini-computer or mainframe, a programmed microprocessor, a micro-controller, a peripheral integrated circuit element, a CSIC (Customer Specific Integrated Circuit) or ASIC (Application Specific Integrated Circuit) or other integrated circuit, a logic circuit, a digital signal processor, a programmable logic device such as a FPGA, PLD, PLA or PAL, or any other device or arrangement of devices that is capable of implementing the steps of the processes of the invention.

The processing machine used to implement the invention may utilize a suitable operating system. Thus, aspects of the invention may include a processing machine running the iOS operating system, the OS X operating system, the Android operating system, the Microsoft Windows™ operating systems, the Unix operating system, the Linux operating system, the Xenix operating system, the IBM AIX™ operating system, the Hewlett-Packard UX™ operating system, the Novell Netware™ operating system, the Sun Microsystems Solaris™ operating system, the OS/2™ operating system, the BeOS™ operating system, the Macintosh operating system, the Apache operating system, an OpenStep™ operating system or another operating system or platform.

It is appreciated that in order to practice the method of the invention as described above, it is not necessary that the processors and/or the memories of the processing machine be physically located in the same geographical place. That is, each of the processors and the memories used by the processing machine may be located in geographically distinct locations and connected so as to communicate in any suitable manner. Additionally, it is appreciated that each of the processor and/or the memory may be composed of different physical pieces of equipment. Accordingly, it is not necessary that the processor be one single piece of equipment in one location and that the memory be another single piece of equipment in another location. That is, it is contemplated that the processor may be two pieces of equipment in two different physical locations. The two distinct pieces of equipment may be connected in any suitable manner. Additionally, the memory may include two or more portions of memory in two or more physical locations.

To explain further, processing, as described above, is performed by various components and various memories. However, it is appreciated that the processing performed by two distinct components as described above may, in accordance with a further embodiment of the invention, be performed by a single component. Further, the processing performed by one distinct component as described above may be performed by two distinct components. In a similar manner, the memory storage performed by two distinct memory portions as described above may, in accordance with a further embodiment of the invention, be performed by a single memory portion. Further, the memory storage performed by one distinct memory portion as described above may be performed by two memory portions.

Further, various technologies may be used to provide communication between the various processors and/or memories, as well as to allow the processors and/or the memories of the invention to communicate with any other entity; i.e., so as to obtain further instructions or to access and use remote memory stores, for example. Such technologies used to provide such communication might include a network, the Internet, Intranet, Extranet, LAN, an Ethernet, wireless communication via cell tower or satellite, or any client server system that provides communication, for example. Such communications technologies may use any suitable protocol such as TCP/IP, UDP, or OSI, for example.

As described above, a set of instructions may be used in the processing of the invention. The set of instructions may be in the form of a program or software. The software may be in the form of system software or application software, for example. The software might also be in the form of a collection of separate programs, a program module within a larger program, or a portion of a program module, for example. The software used might also include modular programming in the form of object oriented programming. The software tells the processing machine what to do with the data being processed.

Further, it is appreciated that the instructions or set of instructions used in the implementation and operation of the invention may be in a suitable form such that the processing machine may read the instructions. For example, the instructions that form a program may be in the form of a suitable programming language, which is converted to machine language or object code to allow the processor or processors to read the instructions. That is, written lines of programming code or source code, in a particular programming language, are converted to machine language using a compiler, assembler or interpreter. The machine language is binary coded machine instructions that are specific to a particular type of processing machine, i.e., to a particular type of computer, for example. The computer understands the machine language.

Any suitable programming language may be used in accordance with the various aspects of the invention. Illustratively, the programming language used may include assembly language, Ada, APL, Basic, C, C++, COBOL, dBase, Forth, Fortran, Java, Modula-2, Pascal, Prolog, REXX, Visual Basic, and/or JavaScript, for example. Further, it is not necessary that a single type of instruction or single programming language be utilized in conjunction with the operation of the system and method of the invention. Rather, any number of different programming languages may be utilized as is necessary and/or desirable.

Also, the instructions and/or data used in the practice of the invention may utilize any compression or encryption technique or algorithm, as may be desired. An encryption module might be used to encrypt data. Further, files or other data may be decrypted using a suitable decryption module, for example.

As described above, the invention may illustratively be embodied in the form of a processing machine, including a computer or computer system, for example, that includes at least one memory. It is to be appreciated that the set of instructions, i.e., the software for example, that enables the computer operating system to perform the operations described above may be contained on any of a wide variety of media or medium, as desired. Further, the data that is processed by the set of instructions might also be contained on any of a wide variety of media or medium. That is, the particular medium, i.e., the memory in the processing machine, utilized to hold the set of instructions and/or the data used in the invention may take on any of a variety of physical forms or transmissions, for example. Illustratively, the medium may be in the form of paper, paper transparencies, a compact disk, a DVD, an integrated circuit, a hard disk, a floppy disk, an optical disk, a magnetic tape, a RAM, a ROM, a PROM, an EPROM, a wire, a cable, a fiber, a communications channel, a satellite transmission, a memory card, a SIM card, or other remote transmission, as well as any other medium or source of data that may be read by the processors of the invention.

Further, the memory or memories used in the processing machine that implements the invention may be in any of a wide variety of forms to allow the memory to hold instructions, data, or other information, as is desired. Thus, the memory might be in the form of a database to hold data. The database might use any desired arrangement of files such as a flat file arrangement or a relational database arrangement, for example.

In the system and method of the invention, a variety of "user interfaces" may be utilized to allow a user to interface with the processing machine or machines that are used to implement the invention. As used herein, a user interface includes any hardware, software, or combination of hardware and software used by the processing machine that allows a user to interact with the processing machine. A user interface may be in the form of a dialogue screen for example. A user interface may also include any of a mouse, touch screen, keyboard, keypad, voice reader, voice recognizer, dialogue screen, menu box, list, checkbox, toggle switch, a pushbutton or any other device that allows a user to receive information regarding the operation of the processing machine as it processes a set of instructions and/or provides the processing machine with information. Accordingly, the user interface is any device that provides communication between a user and a processing machine. The information provided by the user to the processing machine through the user interface may be in the form of a command, a selection of data, or some other input, for example.

As discussed above, a user interface is utilized by the processing machine that performs a set of instructions such that the processing machine processes data for a user. The user interface is typically used by the processing machine for interacting with a user either to convey information or receive information from the user. However, it should be appreciated that in accordance with some aspects of the system and method of the invention, it is not necessary that a human user actually interact with a user interface used by the processing machine of the invention. Rather, it is also contemplated that the user interface of the invention might interact, i.e., convey and receive information, with another processing machine, rather than a human user. Accordingly, the other processing machine might be characterized as a user. Further, it is contemplated that a user interface utilized in the system and method of the invention may interact partially with another processing machine or processing machines, while also interacting partially with a human user.

It will be readily understood by those persons skilled in the art that the present invention is susceptible to broad utility and application. Many aspects and adaptations of the present invention other than those herein described, as well as many variations, modifications and equivalent arrangements, will be apparent from or reasonably suggested by the present invention and foregoing description thereof, without departing from the substance or scope of the invention.

Accordingly, while the present invention has been described here in detail in relation to its exemplary aspects, it is to be understood that this disclosure is only illustrative and exemplary of the present invention and is made to provide an enabling disclosure of the invention. Accordingly, the foregoing disclosure is not intended to be construed or to limit the present invention or otherwise to exclude any other such aspects, adaptations, variations, modifications or equivalent arrangements.

The invention claimed is:

1. A method of identifying and remediating architecture risk, comprising:
    generating a first chaos graph pattern and a second chaos graph pattern;
    training a machine learning model to recognize the first chaos graph pattern and the second chaos graph pattern;
    identifying an architecture graph pattern of an evaluated architecture;
    including the architecture graph pattern in an architecture testing graph;
    processing, by a machine learning engine including the machine learning model, the architecture testing graph, including the architecture graph pattern of the evaluated architecture;
    recognizing, as a result of the processing and by the machine learning engine, that a shape of the architecture graph pattern is similar to a shape of the first chaos graph pattern and that the shape of the architecture graph pattern is similar to a shape of the second chaos graph pattern; and
    predicting, by the machine learning engine and based on the recognizing, a remedial reconfiguration, wherein the remedial reconfiguration includes a reconfiguration of a design of the evaluated architecture.

2. The method of claim 1, wherein the first chaos graph pattern is a graph representation of a first operational system operating in a simulated chaos environment.

3. The method of claim 2, wherein the second chaos graph pattern is a graph representation of a second operational system operating in a simulated chaos environment.

4. The method of claim 2, wherein the first chaos graph pattern is labeled as problematic as a result of the first operational system exhibiting a relatively high level of disruption in the simulated chaos environment.

5. The method of claim 3, wherein the second chaos graph pattern is labeled as robust as a result of the second operational system exhibiting a relatively low level of disruption in the simulated chaos environment, or no level of disruption in the simulated chaos environment.

6. The method of claim 1, wherein remedial reconfiguration shifts the shape of the architecture graph pattern to be less similar to the shape of the first chaos graph pattern, and more similar to the shape of the second chaos graph pattern.

7. The method of claim 1, wherein the remedial reconfiguration is presented to a testing user of the testing architecture graph.

8. The method of claim 1, wherein the remedial reconfiguration is automatically applied to the design of the evaluated architecture.

9. The method of claim 8, wherein the remedial reconfiguration is a reconfiguration of a standard architecture design document of the evaluated architecture.

10. The method of claim 1, wherein the architecture graph pattern is an intended state dimension of the evaluated architecture from an architecture knowledge graph.

11. A system for identifying and remediating architecture risk comprising at least one server including a processor and a memory, wherein the at least one server is configured for operative communication on a technology infrastructure of an evaluating organization, and wherein instructions stored on the memory instruct the processor to:
    generate a first chaos graph pattern and a second chaos graph pattern;
    train a machine learning model to recognize the first chaos graph pattern and the second chaos graph pattern;
    identify an architecture graph pattern of an evaluated architecture;
    include the architecture graph pattern in an architecture testing graph;
    process, by a machine learning engine including the machine learning model, the architecture testing graph, including the architecture graph pattern of the evaluated architecture;
    recognize, as a result of the processing and by the machine learning engine, that a shape of the architecture graph pattern is similar to a shape of the first chaos graph pattern and that the shape of the architecture graph pattern is similar to a shape of the second chaos graph pattern; and
    predict, by the machine learning engine and based on the recognizing, a remedial reconfiguration, wherein the remedial reconfiguration includes a reconfiguration of a design of the evaluated architecture.

12. The system of claim 11, wherein the first chaos graph pattern is a graph representation of a first operational system operating in a simulated chaos environment.

13. The system of claim 12, wherein the second chaos graph pattern is a graph representation of a second operational system operating in a simulated chaos environment.

14. The system of claim 12, wherein the first chaos graph pattern is labeled as problematic as a result of the first operational system exhibiting a relatively high level of disruption in the simulated chaos environment.

15. The system of claim 13, wherein the second chaos graph pattern is labeled as robust as a result of the second operational system exhibiting a relatively low level of disruption in the simulated chaos environment, or no level of disruption in the simulated chaos environment.

16. The system of claim 11, wherein remedial reconfiguration shifts the shape of the architecture graph pattern to be less similar to the shape of the first chaos graph pattern, and more similar to the shape of the second chaos graph pattern.

17. The system of claim 11, wherein the remedial reconfiguration is presented to a testing user of the testing architecture graph.

18. The system of claim 11, wherein the remedial reconfiguration is automatically applied to the design of the evaluated architecture.

19. The system of claim 18, wherein the remedial reconfiguration is a reconfiguration of a standard architecture design document of the evaluated architecture.

20. A non-transitory computer readable storage medium, including instructions stored thereon for predicting and remediating technology architecture risk based on machine learning applied to a graph, which when read and executed by one or more computers cause the one or more computers to perform steps comprising:
    generating a first chaos graph pattern and a second chaos graph pattern;
    training a machine learning model to recognize the first chaos graph pattern and the second chaos graph pattern;

identifying an architecture graph pattern of an evaluated architecture;
including the architecture graph pattern in an architecture testing graph;
processing, by a machine learning engine including the machine learning model, the architecture testing graph, including the architecture graph pattern of the evaluated architecture;
recognizing, as a result of the processing and by the machine learning engine, that a shape of the architecture graph pattern is similar to a shape of the first chaos graph pattern and that the shape of the architecture graph pattern is similar to a shape of the second chaos graph pattern; and
predicting, by the machine learning engine and based on the recognizing, a remedial reconfiguration, wherein the remedial reconfiguration includes a reconfiguration of a design of the evaluated architecture.

* * * * *